US010333060B2

(12) United States Patent
Ha et al.

(10) Patent No.: US 10,333,060 B2
(45) Date of Patent: Jun. 25, 2019

(54) ELECTRONIC DEVICE AND METHOD FOR FABRICATING THE SAME

(71) Applicant: SK hynix Inc., Icheon-Si (KR)

(72) Inventors: Ga-Young Ha, Icheon-si (KR); Ki-Seon Park, Seoul (KR); Jong-Han Shin, Seoul (KR)

(73) Assignee: SK hynix Inc., Icheon-si (KR)

( * ) Notice: Subject to any disclaimer, the term of this patent is extended or adjusted under 35 U.S.C. 154(b) by 121 days.

(21) Appl. No.: 15/677,968

(22) Filed: Aug. 15, 2017

(65) Prior Publication Data
US 2018/0123030 A1    May 3, 2018

(30) Foreign Application Priority Data

Oct. 31, 2016   (KR) .................. 10-2016-0143485

(51) Int. Cl.
*H01L 43/12*     (2006.01)
*G06F 13/16*     (2006.01)
*G06F 13/28*     (2006.01)
*H01L 43/08*     (2006.01)
*H01L 43/10*     (2006.01)
*H01L 45/00*     (2006.01)

(52) U.S. Cl.
CPC .......... *H01L 43/12* (2013.01); *G06F 13/1668* (2013.01); *G06F 13/28* (2013.01); *H01L 43/08* (2013.01); *H01L 43/10* (2013.01); *H01L 45/1675* (2013.01)

(58) Field of Classification Search
CPC ..... H01L 43/12; H01L 43/08; H01L 45/1675; H01L 43/10; G06F 13/28; G06F 13/1668
See application file for complete search history.

(56) References Cited

U.S. PATENT DOCUMENTS 6,750,127 B1 *   6/2004   Chang ................ H01L 21/0332
                                                       257/E21.035
7,576,441 B2     8/2009   Yin et al.
2004/0259355 A1* 12/2004  Yin .................... H01L 21/0332
                                                       438/689

OTHER PUBLICATIONS

Park, S. J., et al., Hard carbon mask for next generation lithographic imaging, Proceedings of International Symposium on Dry Process, vol. 6, Mentor Communications, 2006.
He, Xiao-Ming et al., Plasma-immersion ion-processed boron-doped diamond-like carbon films, J. Phys.: Condens. Matter, 12(8), 2000, L183-L189.

* cited by examiner

*Primary Examiner* — Karen Kusumakar
(74) *Attorney, Agent, or Firm* — Perkins Coie LLP

(57) ABSTRACT

A method for fabricating an electronic device including a semiconductor memory includes: forming an etching target layer over a substrate; forming an initial hard mask pattern including a carbon-containing material over the etching target layer; forming a hard mask pattern by doping an impurity which increases a hardness of the carbon-containing material into a surface portion of the initial hard mask pattern; and etching the etching target layer by using the hard mask pattern as an etching barrier.

23 Claims, 9 Drawing Sheets

ELECTRONIC DEVICE AND METHOD FOR FABRICATING THE SAME

CROSS-REFERENCE TO RELATED APPLICATIONS

This patent document claims priority of Korean Patent Application No. 10-2016-0143485, entitled "ELECTRONIC DEVICE AND METHOD FOR FABRICATING THE SAME" and filed on Oct. 31, 2016, which is incorporated herein by reference in its entirety.

TECHNICAL FIELD

This patent document relates to memory circuits or devices and their applications in electronic devices or systems.

BACKGROUND

Recently, as electronic appliances trend toward miniaturization, low power consumption, high performance, multi-functionality, and so on, semiconductor devices capable of storing information in various electronic appliances such as a computer, a portable communication device, and so on have been demanded in the art, and research has been conducted for the semiconductor devices. Such semiconductor devices include semiconductor devices which can store data using a characteristic that they are switched between different resistant states according to an applied voltage or current, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device which is capable of improving characteristics of a variable resistance element and fabricating processes.

In an implementation, a method for fabricating an electronic device including a semiconductor memory includes: forming an etching target layer over a substrate; forming an initial hard mask pattern including a carbon-containing material over the etching target layer; forming a hard mask pattern by doping an impurity which increases a hardness of the carbon-containing material into a surface portion of the initial hard mask pattern; and etching the etching target layer by using the hard mask pattern as an etching barrier.

Implementations of the above method may include one or more the following.

The carbon-containing material includes an amorphous carbon or a Diamond-Like Carbon (DLC). The impurity includes Si or B. The surface portion includes a Si—C bonding or a B—C bonding, and a remaining portion of the initial hard mask pattern, except for the surface portion, includes a C—C bonding or a C—H bonding. The forming of the hard mask pattern is performed by flowing a gas including the impurity. The forming of the hard mask pattern is performed by implanting ions of the impurity. The method further comprises: removing the hard mask pattern after the etching of the etching target layer. The removing of the hard mask pattern includes an oxygen strip process. In the removing of the hard mask pattern, a whole of the hard mask pattern is removed, and wherein a volume of the surface portion is smaller than a volume of a remaining portion of the initial hard mask pattern, except for the surface portion. In the etching of the etching target layer, a remaining portion of the initial hard mask pattern, except for the surface portion, is exposed by a loss of an upper portion of the surface portion, and the method further comprises: removing the exposed remaining portion after the etching of the etching target layer. The method further comprises: additionally etching the etching target layer by using a remaining part of the surface portion, which has not been lost, as an etching barrier after the removing of the exposed remaining portion. A volume of the surface portion is equal to or larger than a volume of the remaining portion of the initial hard mask pattern. The etching target layer includes one or more layers having a variable resistance characteristic. The etching target layer includes a Magnetic Tunnel Junction (MTJ) structure that includes a free layer having a variable magnetization direction, a pinned layer having a fixed magnetization direction, and a tunnel barrier layer interposed between the free layer and the pinned layer. In the forming of the hard mask pattern, the impurity is doped into at least a portion of the etching target layer.

In another implementation, an electronic device includes: a semiconductor memory, wherein the semiconductor memory may include: a substrate; and a variable resistance element formed over the substrate, and wherein at least a portion of a sidewall of the variable resistance element further contains Si or B compared to a remaining portion of the variable resistance element.

Implementations of the above device may include one or more the following.

The portion of variable resistance element is relatively amorphous compared to the remaining portion of the variable resistance element. The variable resistance element includes a Magnetic Tunnel Junction (MTJ) structure that includes a free layer having a variable magnetization direction, a pinned layer having a fixed magnetization direction, and a tunnel barrier layer interposed between the free layer and the pinned layer.

The electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

The electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory is part of the cache memory unit in the processor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

The electronic device may further include a data storage system which includes: a storage device configured to store data and conserve stored data regardless of power supply; a controller configured to control input and output of data to and from the storage device according to a command inputted from an outside; a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

The electronic device may further include a memory system which includes: a memory configured to store data and conserve stored data regardless of power supply; a memory controller configured to control input and output of data to and from the memory according to a command inputted from an outside; a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

These and other aspects, implementations and associated advantages are described in greater detail in the drawings, the description and the claims.

DETAILED DESCRIPTION

Figure 1:
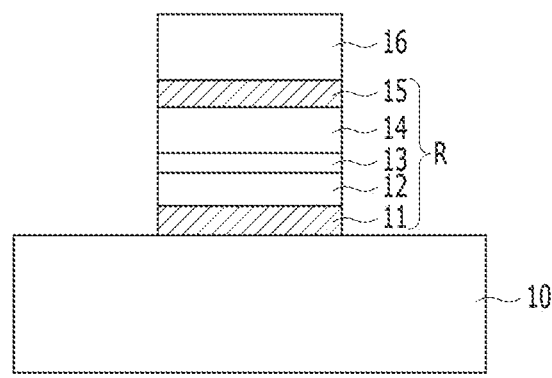
FIG. 1 is a cross-sectional view illustrating a method for fabricating an electronic device according to a comparative example.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

FIG. 1 shows an example of a cross-sectional view of a device structure during fabrication to illustrate a method for fabricating an electronic device according to a comparative example and a problem thereof.

Referring to FIG. 1, a variable resistance element R may be formed over a substrate 10 in which a certain lower structure (not shown) is formed. The variable resistance element R may be patterned to have a certain shape, for example, a pillar shape.

The variable resistance element R is structured to exhibit different resistance states of different resistance values for representing different data for data storage. A resistance state of the variable resistance element R may be switched between different resistance states by applying a voltage or current of a sufficient magnitude to the variable resistance element, for example, an upper end and a lower end of the variable resistance element. Therefore, the variable resistance element R is capable of storing different data. In this comparative example, the variable resistance element R may include a Magnetic Tunnel Junction (MTJ) structure which includes a free layer 12 having a variable magnetization direction, a pinned layer 14 having a fixed magnetization direction, and a tunnel barrier layer 13 interposed between the free layer 12 and the pinned layer 14 and allowing tunneling of electrons if necessary, a lower electrode layer 11 disposed under the MTJ structure, and an upper electrode layer 15 disposed over the MTJ structure.

The variable resistance element R may be formed by depositing material layers for forming the lower electrode layer 11, the free layer 12, the tunnel barrier layer 13, the pinned layer 14 and the upper electrode layer 15 over the substrate 10, forming a hard mask pattern 16 over the material layers, and etching the material layers using the hard mask pattern 16 as an etching barrier.

The etching process for forming the variable resistance element R may be difficult because electronic devices are highly integrated, the number of layers included in the variable resistance element R increases for improving characteristics of the variable resistance element R, and the MTJ structure includes materials that is relatively difficult to etch. For example, it may be difficult to secure an appropriate hard mask material for forming the variable resistance element R. Since a metal which is generally used as the hard mask pattern 16 has a low etching selectivity and a low hardness as compared to the MTJ structure of the variable resistance element R, the hard mask pattern 16 tend to be lost during the etching process for forming the variable resistance element R and such loss of the hard mask pattern 16 may be significant. Accordingly, the hard mask pattern 16 also makes difficult to secure a vertical profile of a sidewall of the variable resistance element R.

The disclosed technology provides an implementation of a variable resistance element and its fabricating method using a new hard mask pattern capable of improving a patterning of a variable resistance element. In the present implementation, a new hard mask pattern capable of etching various etching target layers that are difficult to etch are provided.

FIGS. 2A to 2D are cross-sectional views illustrating an electronic device according to an implementation of the present disclosure and a method for fabricating the same.

Figure 2A:
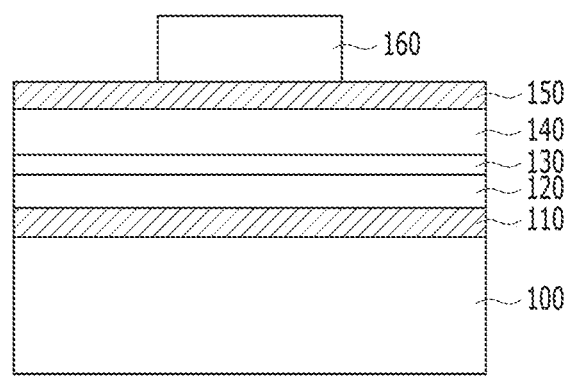
FIGS. 2A to 2D are cross-sectional views illustrating an electronic device according to an implementation of the present disclosure and a method for fabricating the same.

Referring to FIG. 2A, a substrate 100 in which a certain lower structure (not shown) is formed may be provided. The certain lower structure may include a contact plug disposed under a variable resistance element and coupled to the variable resistance element and supplies a voltage or current to the variable resistance element, and a switching element which is coupled to the contact plug and controls an access to the variable resistance element, etc.

Then, material layers for forming the variable resistance element, for example, a lower electrode layer 110, a free layer 120, a tunnel barrier layer 130, a pinned layer 140 and an upper electrode layer 150 may be formed over the substrate 100.

The free layer 120 may have a variable magnetization direction to store different data, and be referred to as a storage layer. The pinned layer 140 may have a fixed magnetization direction to be compared with the magnetization direction of the free layer 120, and be referred to as a reference layer. Each of the free layer 120 and the pinned layer 140 may have a single-layered structure or a multi-layered structure that includes a ferromagnetic material. The ferromagnetic material may include an alloy including Fe, Ni or Co as its major component. For example, the ferromagnetic material may include Fe—Pt alloy, Fe—Pd alloy, Co—Pd alloy, Co—Pt alloy, Fe—Ni—Pt alloy, Co—Fe—Pt alloy, Co—Ni—Pt alloy, Fe—Pd alloy, Co—Fe—B alloy, or others. Alternatively, the ferromagnetic material may include a stack structure of Co/Pt, Co/Pd, or others. The magnetization directions of the free layer 120 and the pinned layer 140 may be substantially parallel to a direction perpendicular to an interface between layers of the variable resistance element, for example, an interface between the free layer 120 and the tunnel barrier layer 130. That is, the magnetization direction of the free layer 120 may be varied between a direction from top to bottom and a direction from bottom to top. The magnetization direction of the pinned layer 140 may be fixed in a direction from top to bottom or in a direction from bottom to top. The magnetization direction of the free layer 120 may be varied by a spin transfer torque. Relative positions of the free layer 120 and the pinned layer 140 may be changed with each other with regard to the tunnel barrier layer 130 between the free layer 120 and the pinned layer 140. For example, unlike this implementation, the pinned layer 140 may be located under the tunnel barrier layer 130, and the free layer 120 may be located over the tunnel barrier layer 130.

The tunnel barrier layer 130 may allow tunneling of electrons between the free layer 120 and the pinned layer 140 if necessary, for example, during a data writing operation for changing a resistance state of the variable resistance element. The tunnel barrier layer 130 may include an insulating oxide, for example, MgO, CaO, SrO, TiO, VO, NbO, or others.

The free layer 120, the tunnel barrier layer 130 and the pinned layer 140 may form an MTJ (Magnetic Tunnel Junction) structure.

The lower electrode layer 110 may be disposed under the MTJ structure and provide a connection between the MTJ structure and the substrate 100. The lower electrode layer 110 may perform various functions in order to improve the characteristics of the MTJ structure, and have a single-layered structure or a multi-layered structure which includes a conductive material. The upper electrode layer 170 may be disposed over the MTJ structure and provide a connection between the MTJ structure and an element positioned over the MTJ structure (for example, see a reference numeral 180 in FIG. 2D). The upper electrode layer 170 may perform various functions in order to improve the characteristics of the MTJ structure, and have a single-layered structure or a multi-layered structure which includes a conductive material.

In some implementations, although not shown, in addition to the material layers 110, 120, 130, 140 and 150 for forming the variable resistance element, one or more additional layers having various purposes can be further included to improve the characteristics of the MTJ structure or fabricating processes may be further formed.

Then, an initial hard mask pattern 160 for patterning the material layers 110, 120, 130, 140 and 150 may be formed over the material layers 110, 120, 130, 140 and 150. The initial hard mask pattern 160 may include a carbon-containing material such as an amorphous carbon, a Diamond-Like Carbon (DLC), or others. The initial hard mask pattern 160 may be formed by depositing a carbon-containing material over the material layers 110, 120, 130, 140 and 150, and selectively etching the carbon-containing material. Since the carbon-containing material has a relatively low hardness, the selective etching of the carbon-containing material may be easy. However, the initial hard mask pattern 160 including the carbon-containing material may not have sufficient hardness to etch the material layers 110, 120, 130, 140 and 150. Therefore, a subsequent process shown in FIG. 2B may be performed.

Figure 2B:
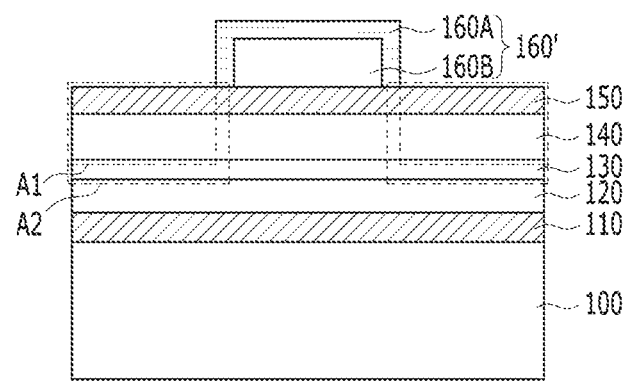

Referring to FIG. 2B, an impurity which increases the hardness of the carbon-containing material may be doped into a surface portion including a sidewall and an upper surface of the initial hard mask pattern 160. The impurity may include a silicon (Si) or a boron (B). The doping of the impurity may be performed by flowing a silicon-containing gas, for example, $SiH_4$ gas, or a boron-containing gas, for example, $B_2H_6$ gas. In the present implementation, the doping of the impurity may be controlled such that only the surface portion of the initial hard mask pattern 160 is doped with the impurity. When flowing the silicon-containing gas or the boron-containing gas, the impurity may be contained only in the surface portion of the initial hard mask pattern 160 by adjusting process conditions, for example, by shortening the flow time. Alternatively, the doping of the impurity may be performed by an ion implantation process of a silicon or a boron. During the ion implantation process, the impurity may be contained only in the surface portion of the initial hard mask pattern 160 by adjusting process conditions, for example, by reducing the ion implantation energy.

As a result, the surface portion of the initial hard mask pattern 160 may be transformed into an impurity doped carbon-containing material. Hereinafter, this surface portion including the impurity doped carbon-containing material will be denoted by a reference numeral 160A. Also, a remaining portion of the initial hard mask pattern 160, except for the surface portion 160A, may be maintained as the carbon-containing material which does not include the impurity. Hereinafter, this remaining portion will be denoted by a reference numeral 160B. The remaining portion 160B including the carbon-containing material and the surface portion 160A including the carbon-containing material and the impurity may be referred to as a final hard mask pattern 160'. The surface portion 160A of the final hard mask pattern 160' may have a hardness greater than a hardness of the remaining portion 160B of the final hard mask pattern 160'. This is because a C—C bonding or a C—H bonding of the carbon-containing material is broken in the surface portion 160A, and a Si—C bonding or a B—C bonding which has a greater bonding force than the C—C bonding or the C—H bonding is formed in the surface portion 160. A size and/or a volume of the surface portion 160A may be smaller than a size and/or a volume of the remaining portion 160B. This is for facilitating a subsequent process to remove the final hard mask pattern 160'. For reference, since the final hard mask pattern 160' has an insulating property, it is necessary to remove the final hard mask pattern 160' in order to couple the variable resistance element to an element located over the variable resistance element.

Meanwhile, when doping the initial hard mask pattern 160 with the impurity, the impurity may also be doped into the material layers 110, 120, 130, 140 and 150 exposed by the initial hard mask pattern 160 to a certain depth. A depth or a width of an impurity doping region formed in the material layers 110, 120, 130, 140 and 150 may be variously modified according to a condition of a fabricating process. For example, as indicated by a reference numeral A1, an inner sidewall of the impurity doping region may be aligned with an outer sidewall of the final hard mask pattern 160'. Alternatively, as indicated by a reference numeral A2, an inner sidewall of the impurity doping region may penetrate below the final hard mask pattern 160' to a certain extent. For convenience of explanation, the region denoted by the reference numeral A1 may be referred to as a first impurity doping region, and the region denoted by the reference numeral A2 may be referred to as a second impurity doping region. When the material layers 110, 120, 130, 140 and 150 may have a crystalline structure, the crystalline structure may be transformed into an amorphous structure by the impurity doping. That is, the first impurity doping region A1 or the second impurity doping region A2 may be relatively amorphous compared to a remaining portion of the material layers 110, 120, 130, 140 and 150.

Figure 2C:
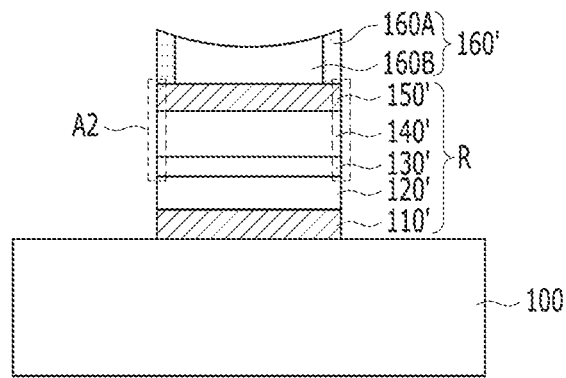

Referring to FIG. 2C, a variable resistance element R in which a lower electrode 110', a free layer pattern 120', a tunnel barrier layer pattern 130', a pinned layer pattern 140' and an upper electrode 150' are stacked may be formed by etching the material layers 110, 120, 130, 140 and 150 by using the final hard mask pattern 160' as an etching barrier. This etching process may be performed by a physical etching process such as an Ion Bean Etching (IBE), etc.

Here, since the surface portion 160A of the final hard mask pattern 160' has a strong hardness, a loss of the surface portion 160A may be reduced during the etching process of the material layers 110, 120, 130, 140 and 150. Specially, a sidewall of the surface portion 160A may be maintained, and thus a vertical profile of a sidewall of the variable resistance element R may be secured. As a result, characteristics of the variable resistance element R may be secured.

During the etching process of the material layers 110, 120, 130, 140 and 150, an upper portion of the surface portion 160A may be lost, and thus the remaining portion 160B may be exposed.

When the first impurity doping region A1 is formed in the process of FIG. 2B, the first impurity doping region A1 may be completely removed in this etching process. On the other hand, when the second impurity doping region A2 is formed in the process of FIG. 2B, a portion of the second impurity doping region A2 may not be removed in this etching process and remain. In this case, at least a portion of the sidewall of the variable resistance element R may include the second impurity doping region A2. The second impurity doping region A2 of the variable resistance element R may further include a silicon or a boron and be amorphous compared to a remaining portion of the variable resistance element R.

Figure 2D:
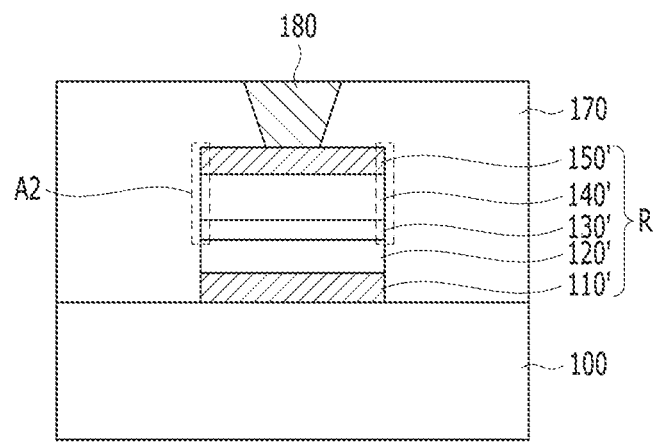

Referring to FIG. 2D, the remaining final hard mask pattern 160' may be removed. Here, the remaining portion 160B including the carbon-containing material may be easily removed by a process such as an oxygen strip process. The surface portion 160A including the impurity doped carbon-containing material may not be removed by the oxygen strip process. However, since a thin sidewall portion of the surface portion 160A remains in this process, the removal of the surface portion 160A may not be difficult. As a result, the final hard mask pattern 160' may be easily removed.

Then, an interlayer insulating layer 170 covering the substrate 100 in which the variable resistance element R is formed may be formed, and then, a contact plug 180 penetrating through the interlayer insulating layer 170 and coupled to the variable resistance element R may be formed. A line (now shown) such as a bit line may be formed over the contact plug 180, and thus a voltage or current may be provided to an upper end of the variable resistance element R.

By the aforementioned processes, the electronic device shown in FIG. 2D may be fabricated.

Referring again to FIG. 2D, the electronic device according to the implementation may include the variable resistance element R formed over the substrate 100.

For example, the variable resistance element R may include the MTJ structure which includes the free layer pattern 120', the pinned layer pattern 140' and the tunnel barrier layer pattern 130' interposed therebetween. Furthermore, the variable resistance element R may include the lower electrode 110' located under the MTJ structure and the upper electrode 150' located over the MTJ structure. Furthermore, the variable resistance element R may include one or more additional layers having various functions such as improving the characteristics of the MTJ structure.

In the variable resistance element R, the magnetization direction of the free layer pattern 120' may be changed according to a voltage or current applied through a contact plug (not shown) formed in the substrate 100 and coupled to a lower end of the variable resistance element R and the contact plug 180 located over the variable resistance element R to the lower and upper ends of the variable resistance element R, and thus data may be stored. When the magnetization directions of the free layer pattern 120' and the pinned layer pattern 140' are parallel to each other, the variable resistance element R may be in a low resistance state, and store data '1'. On the other hand, when the magnetization directions of the free layer pattern 120' and the pinned layer pattern 140' are anti-parallel to each other, the variable resistance element R may be in a high resistance state, and store data '0'.

At least a portion of the sidewall of the variable resistance element R may include the second impurity doping region A2. The second impurity doping region A2 may further include a silicon or a boron compared to a remaining region of the variable resistance element R. Also, the second impurity doping region A2 may be amorphous compared to the remaining region of the variable resistance element R.

The aforementioned fabricating method of the electronic device may have following advantages.

First, since the hardness of the surface portion 160A of the final hard mask pattern 160' increases, the final hard mask pattern 160' may function better as an etching barrier during the etching process of the material layers 110, 120, 130, 140 and 150. Specially, since the sidewall portion of the surface portion 160A may be maintained, a vertical profile of the variable resistance element R may be obtained, and thus required characteristics of the variable resistance element R may be secured.

Also, since the remaining portion 160B including the carbon-containing material occupies most of the final hard mask pattern 160', the final hard mask pattern 160' may be easily removed.

Furthermore, since the initial hard mask pattern 160 includes the carbon-containing material which has a low hardness, the patterning of the initial hard mask pattern 160 may be easy.

As a result, by the present implementation, a variable resistance element including an MTJ structure which is difficult to etch may be easily formed, characteristics of the variable resistance element may be secured, and fabricating processes such as a forming process and a removing process of a hard mask pattern may be easy.

Meanwhile, in the above fabricating method of the electronic device, one or more material layers for forming another variable resistance element, instead of the variable resistance element including the MTJ structure may also be etched by using the above hard mask pattern. The one or more material layers for forming another variable resistance element may be used in an RRAM, a PRAM, an FRAM, etc. For example, another variable resistance element may have a single-layered structure or a multi-layered structure including a metal oxide such as a transition metal oxide, a perovskite-based material and the like, a phase change material such as a chalcogenide-based material, or a ferroelectric material.

Furthermore, in the above fabricating method of the electronic device, any etching target layer which is difficult to etch, instead of the variable resistance element including the MTJ structure, may also be etched by using the above hard mask pattern. The etching target layer may have a single-layered structure or a multi-layered structure including various conductive materials and/or insulating materials.

Meanwhile, in the above implementation, by controlling a size and/or a volume of a surface portion of a hard mask pattern, at least a portion of the surface portion of the hard mask pattern may remain. In this case, a variable resistance element or an etching target layer pattern having a reduced size may be formed. An example of this will be described with reference to FIGS. 3A to 3E.

FIGS. 3A to 3E are cross-sectional views illustrating an electronic device according to another implementation of the present disclosure and a method for fabricating the same. A detailed description of substantially the same portion as the aforementioned implementation will be omitted Referring to FIG. 3A, a substrate 200 in which a certain lower structure (not shown) is formed may be provided.

Then, material layers for forming a variable resistance element, for example, a lower electrode layer 210, a free layer 220, a tunnel barrier layer 230, a pinned layer 240 and an upper electrode layer 250 may be formed over the substrate 200.

Then, an initial hard mask pattern 260 for patterning the material layers 210, 220, 230, 240 and 250 may be formed over the material layers 210, 220, 230, 240 and 250. The initial hard mask pattern 260 may include a carbon-containing material.

Figure 3A:
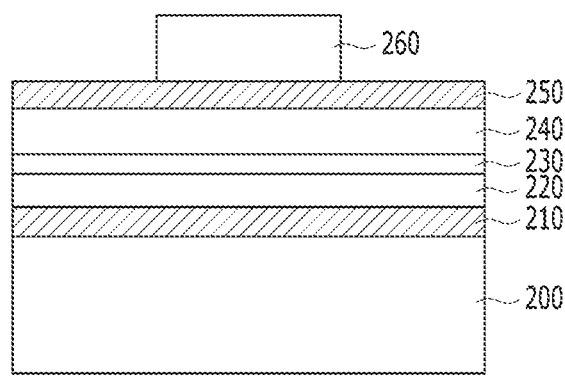
FIGS. 3A to 3E are cross-sectional views illustrating an electronic device according to another implementation of the present disclosure and a method for fabricating the same.
Figure 3B:
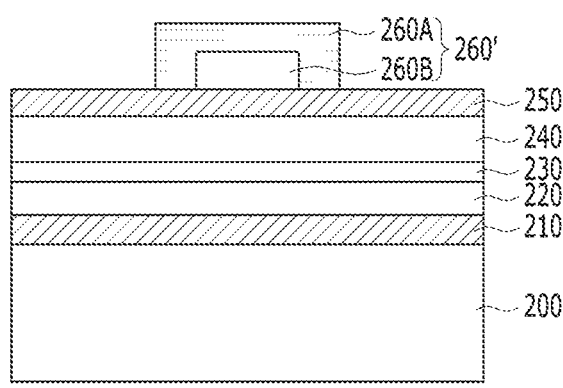

Referring to FIG. 3B, an impurity which increases a hardness of the carbon-containing material may be doped into a surface portion, that is, a sidewall and an upper surface of the initial hard mask pattern 260. The impurity may include a silicon or a boron. The doping of the impurity may be performed by flowing a silicon-containing gas or a boron-containing gas. Alternatively, the doping of the impurity may be performed by an ion implantation process of a silicon or a boron.

As a result, the initial hard mask pattern 260 may be transformed into a middle hard mask pattern 260'. The middle hard mask pattern 260' may include a surface portion 260A which includes an impurity doped carbon-containing material and a remaining portion 260B which has a sidewall and an upper surface surrounded by the surface portion 260A and does not contain the impurity of the surface portion 260A. The surface portion 260A may have a hardness larger than a hardness of the remaining portion 260B.

Here, a size and/or a volume of the surface portion 260A may increase compared to the aforementioned implementation. For example, the size and/or the volume of the surface portion 260A may be equal to or larger than a size and/or a volume of the remaining portion 260B. This is possible by controlling the impurity doping process. For example, a flow time of a silicon-containing gas or a boron-containing gas may increase compared to the aforementioned implementation. Alternatively, an ion implantation energy of a silicon or a boron may increase compared to the aforementioned implementation.

Although not shown, during this impurity doping process, the impurity may also be doped into the material layers 210, 220, 230, 240 and 250 which is exposed by the initial hard mask pattern 260.

Figure 3C:
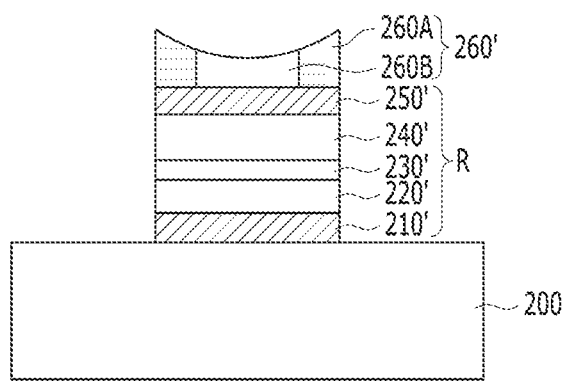

Referring to FIG. 3C, an initial variable resistance element R in which an initial lower electrode 210', an initial free layer pattern 220', an initial tunnel barrier layer pattern 230', an initial pinned layer pattern 240' and an initial upper electrode 250' are stacked may be formed by etching the material layers 210, 220, 230, 240 and 250 by using the middle hard mask pattern 260' as an etching barrier.

Here, since the surface portion 260A of the middle hard mask pattern 260' has a strong hardness, a patterning process for the initial variable resistance element R may be easy and a vertical profile of a sidewall of the initial variable resistance element R may be secured.

During this etching, an upper portion of the surface portion 260A may be lost, and thus the remaining portion 260B may be exposed.

Figure 3D:
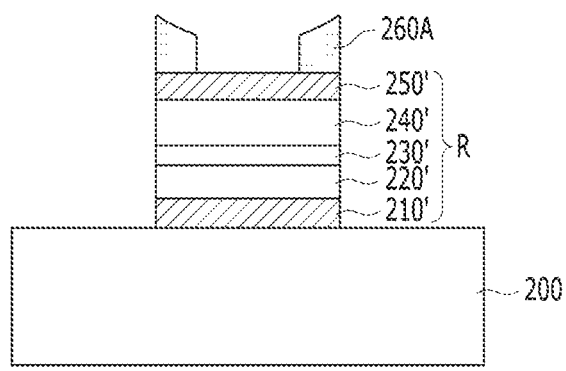

Referring to FIG. 3D, the remaining portion 260B of the remaining middle hard mask pattern 260' may be removed.

The remaining portion 260B may be easily removed by a process such as an oxygen strip process. Here, since the surface portion 260A of which a sidewall portion remains has a relatively large width compared to the aforementioned implementation, the surface portion 260A may not be removed during the removal process of the remaining portion 260B, and remain.

Figure 3E:
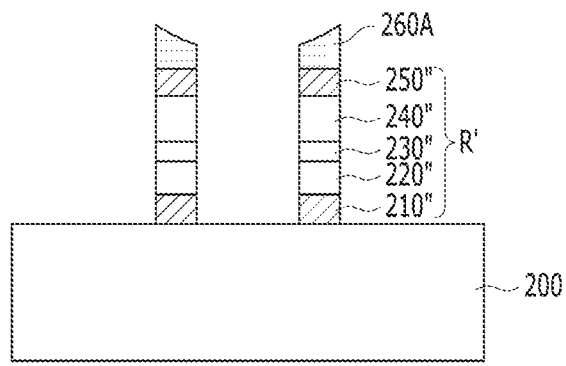

Referring to FIG. 3E, the initial variable resistance element R may be etched by using the remaining surface portion 260A shown in FIG. 3D as an etching barrier. As a result, a variable resistance element R' in which a lower electrode 210", a free layer pattern 220", a tunnel barrier layer pattern 230", a pinned layer pattern 240" and an upper electrode 250" are stacked may be formed.

The variable resistance element R' may have a size and/or a width smaller than a size and/or a width of the initial variable resistance element R. That is, it may be advantageous for securing high integration of the electronic device. Since the surface portion 260A has a strong hardness, a patterning process for the variable resistance element R' may be easy and a vertical profile of a sidewall of the variable resistance element R' may be secured.

Then, although not shown, the surface portion 260A may be removed. The surface portion 260A may be lost in the forming process of the variable resistance element R' to a certain extent, and thus it may be easily removed.

Then, although not shown an interlayer insulating layer covering the substrate 200 in which the variable resistance element R' is formed may be formed, and then, a contact plug penetrating through the interlayer insulating layer and coupled to the variable resistance element R' may be formed.

In the present implementation, the variable resistance element R' may be replaced by a single-layered structure or a multi-layered structure exhibiting a variable resistance characteristic, instead of the MTJ structure. Furthermore, the variable resistance element R' may be replaced by various etching target layers.

The above and other memory circuits or semiconductor devices based on the disclosed technology can be used in a range of devices or systems. FIGS. 4-8 provide some examples of devices or systems that can implement the memory circuits disclosed herein.

Figure 4:
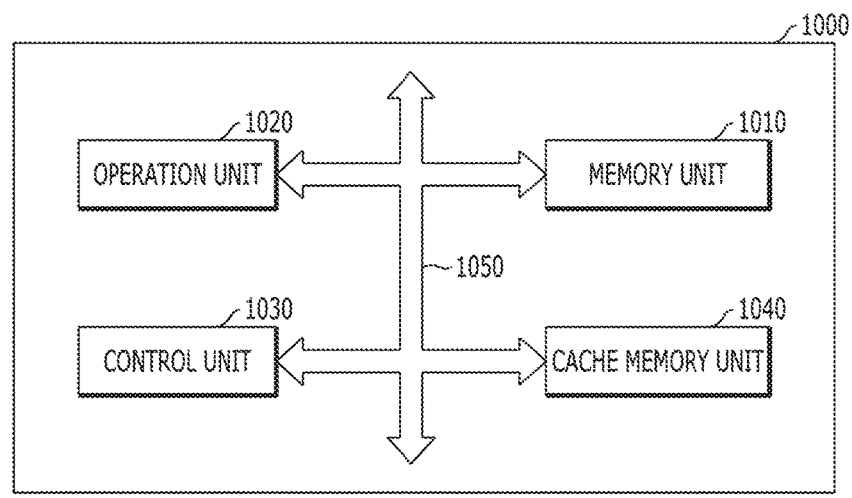
FIG. 4 is an example of configuration diagram of a microprocessor implementing memory circuitry based on the disclosed technology.

FIG. 4 is an example of configuration diagram of a microprocessor implementing memory circuitry based on the disclosed technology.

Referring to FIG. 4, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include a substrate; and a variable resistance element formed over the substrate, and wherein at least a portion of a sidewall of the variable resistance element further contains Si or B compared to a remaining portion of the variable resistance element. Through this, data storage characteristics and operating characteristics of the memory unit 1010 may be improved and fabricating processes may be improved. As a consequence, operating characteristics of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 5:
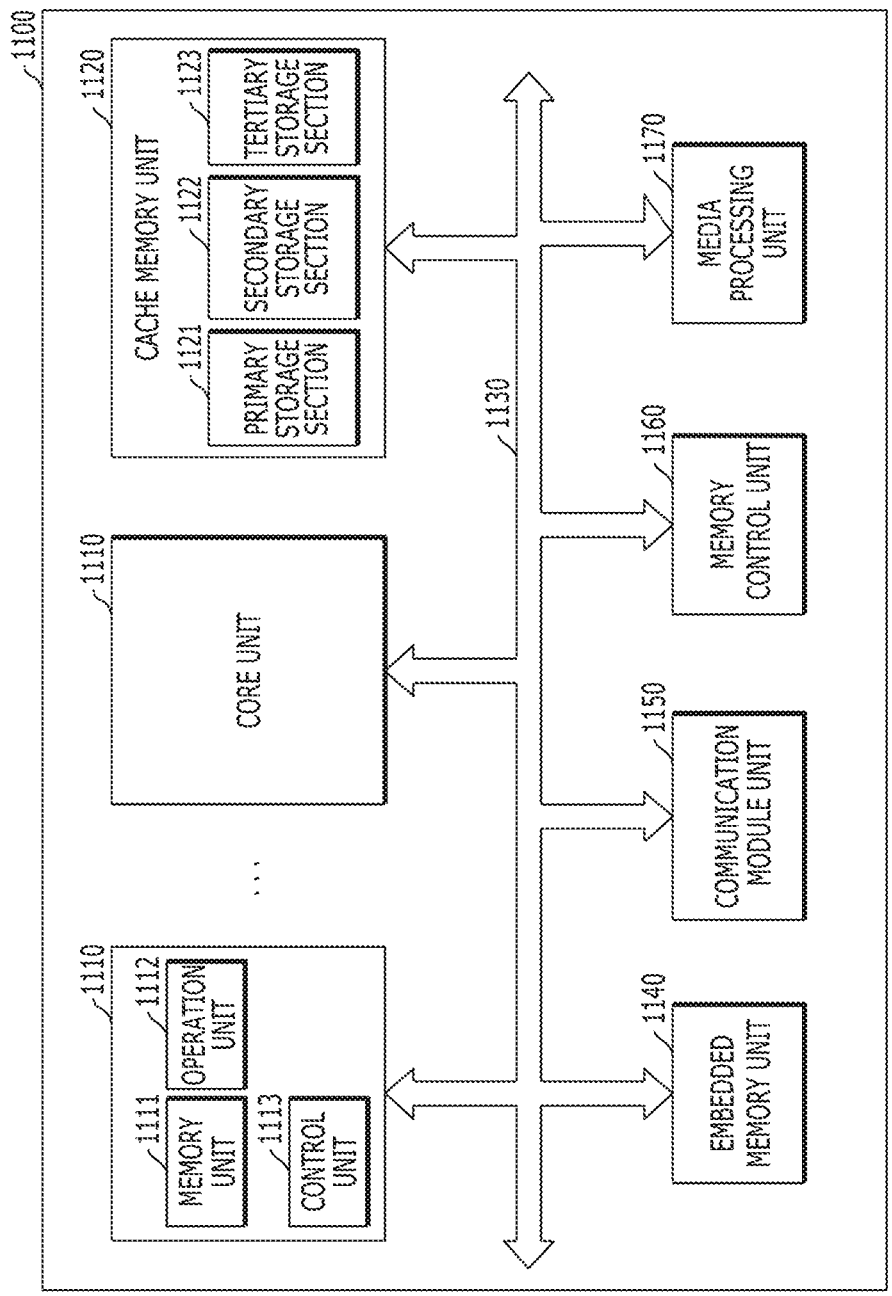
FIG. 5 is an example of configuration diagram of a processor implementing memory circuitry based on the disclosed technology.

FIG. 5 is an example of configuration diagram of a processor implementing memory circuitry based on the disclosed technology.

Referring to FIG. 5, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a substrate; and a variable resistance element formed over the substrate, and wherein at least a portion of a sidewall of the variable resistance element further contains Si or B compared to a remaining portion of the variable resistance element. Through this, data storage characteristics and operating characteristics of the cache memory unit 1120 may be improved and fabricating processes may be improved. As a consequence, operating characteristics of the processor 1100 may be improved.

Although it was shown in FIG. 5 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 6:
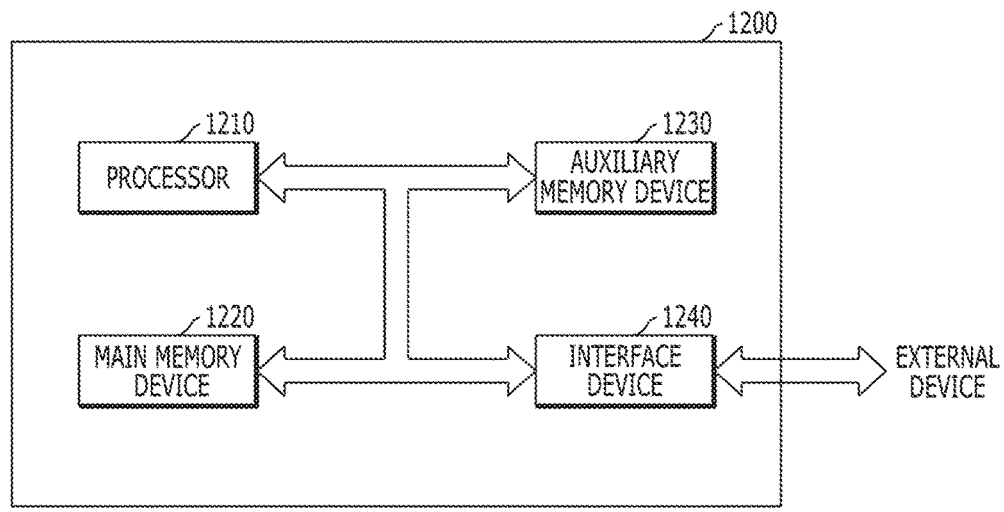
FIG. 6 is an example of configuration diagram of a system implementing memory circuitry based on the disclosed technology.

FIG. 6 is an example of configuration diagram of a system implementing memory circuitry based on the disclosed technology.

Referring to FIG. 6, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a substrate; and a variable resistance element formed over the substrate, and wherein at least a portion of a sidewall of the variable resistance element further contains Si or B compared to a remaining portion of the variable resistance element. Through this, data storage characteristics and operating characteristics of the main memory device 1220 may be improved and fabricating processes may be improved. As a consequence, operating characteristics of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a substrate; and a variable resistance element formed over the substrate, and wherein at least a portion of a sidewall of the variable resistance element further contains Si or B compared to a remaining portion of the variable resistance element. Through this, data storage characteristics and operating characteristics of the auxiliary memory device 1230 may be improved and fabricating processes may be improved. As a consequence, operating characteristics of the system 1200 may be improved.

Also, the auxiliary memory device 1230 may further include a data storage system (see the reference numeral 1300 of FIG. 7) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 7) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 7:
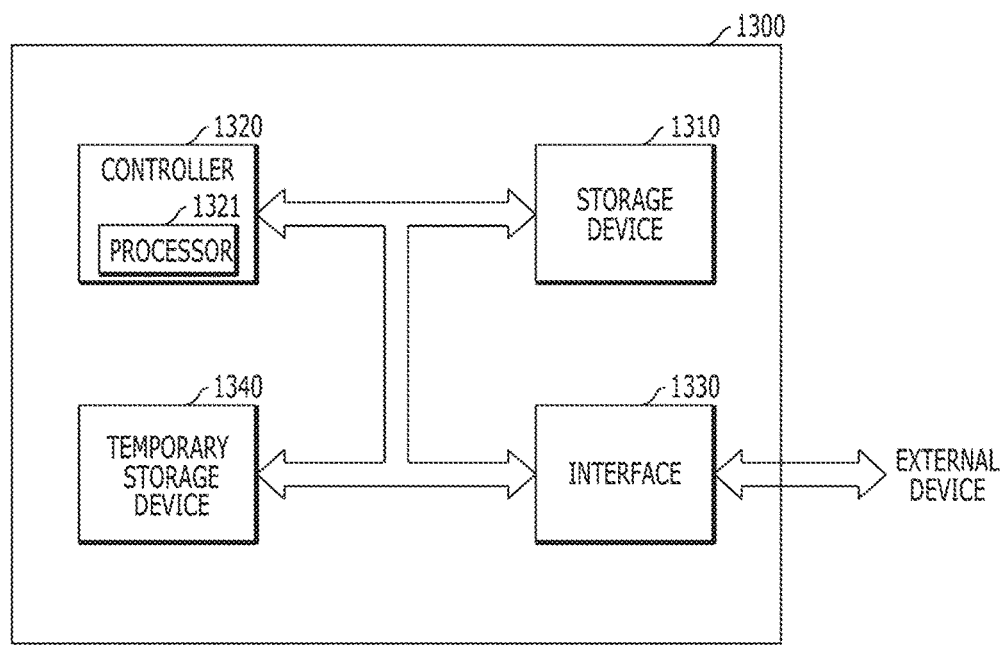
FIG. 7 is an example of configuration diagram of a data storage system implementing memory circuitry based on the disclosed technology.

FIG. 7 is an example of configuration diagram of a data storage system implementing memory circuitry based on the disclosed technology.

Referring to FIG. 7, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include a substrate; and a variable resistance element formed over the substrate, and wherein at least a portion of a sidewall of the variable resistance element further contains Si or B compared to a remaining portion of the variable resistance element. Through this, data storage characteristics and operating characteristics of the storage device 1310 or the temporary storage device 1340 may be improved and fabricating processes may be improved. As a consequence, operating characteristics and data storage characteristics of the data storage system 1300 may be improved.

Figure 8:
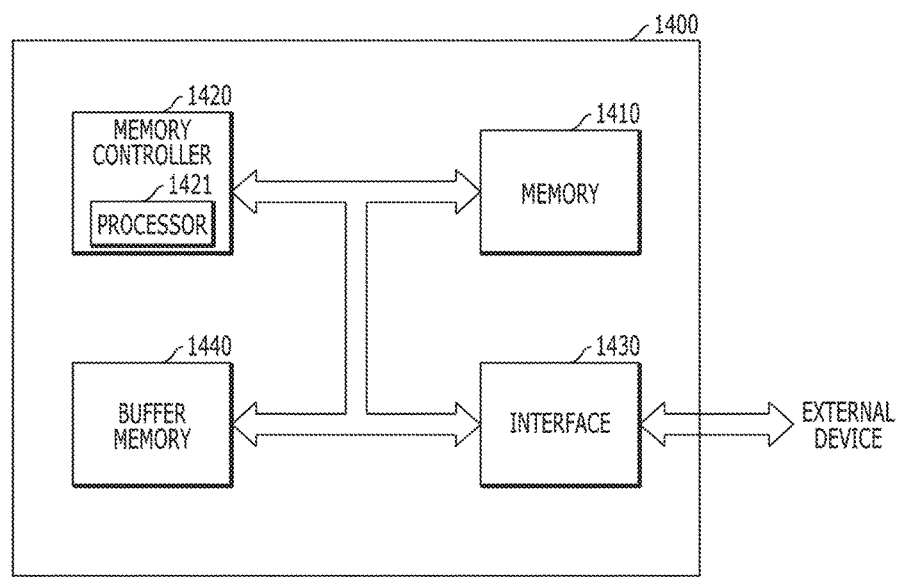
FIG. 8 is an example of configuration diagram of a memory system implementing memory circuitry based on the disclosed technology.

FIG. 8 is an example of configuration diagram of a memory system implementing memory circuitry based on the disclosed technology.

Referring to FIG. 8, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a substrate; and a variable resistance element formed over the substrate, and wherein at least a portion of a sidewall of the variable resistance element further contains Si or B compared to a remaining portion of the variable resistance element. Through this, data storage characteristics and operating characteristics of the memory 1410 may be improved and fabricating processes may be improved. As a consequence, operating characteristics and data storage characteristics of the memory system 1400 may be improved.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a substrate; and a variable resistance element formed over the substrate, and wherein at least a portion of a sidewall of the variable resistance element further contains Si or B compared to a remaining portion of the variable resistance element. Through this, data storage characteristics and operating characteristics of the buffer memory 1440 may be improved and fabricating processes may be improved. As a consequence, operating characteristics and data storage characteristics of the memory system 1400 may be improved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 4-8 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. A method for fabricating an electronic device including a semiconductor memory, comprising:
   forming an etching target layer over a substrate;
   forming an initial hard mask pattern including a carbon-containing material over the etching target layer;
   forming a hard mask pattern by doping an impurity which increases a hardness of the carbon-containing material into a surface portion of the initial hard mask pattern; and
   etching the etching target layer by using the hard mask pattern as an etching barrier.

2. The method according to claim 1, wherein the carbon-containing material includes an amorphous carbon or a Diamond-Like Carbon (DLC).

3. The method according to claim 1, wherein the impurity includes Si or B.

4. The method according to claim 3, wherein the surface portion includes a Si—C bonding or a B—C bonding, and a remaining portion of the initial hard mask pattern, except for the surface portion, includes a C—C bonding or a C—H bonding.

5. The method according to claim 1, wherein the forming of the hard mask pattern is performed by flowing a gas including the impurity.

6. The method according to claim 1, wherein the forming of the hard mask pattern is performed by implanting ions of the impurity.

7. The method according to claim 1, further comprising:
   removing the hard mask pattern after the etching of the etching target layer.

8. The method according to claim 7, wherein the removing of the hard mask pattern includes an oxygen strip process.

9. The method according to claim 7, wherein, in the removing of the hard mask pattern, a whole of the hard mask pattern is removed, and
   wherein a volume of the surface portion is smaller than a volume of a remaining portion of the initial hard mask pattern, except for the surface portion.

10. The method according to claim 1, wherein, in the etching of the etching target layer, a remaining portion of the initial hard mask pattern, except for the surface portion, is exposed by a loss of an upper portion of the surface portion, and
    the method further comprising:
    removing the exposed remaining portion after the etching of the etching target layer.

11. The method according to claim 10, further comprising:
    additionally etching the etching target layer by using a remaining part of the surface portion, which has not been lost, as an etching barrier after the removing of the exposed remaining portion.

12. The method according to claim 10, wherein a volume of the surface portion is equal to or larger than a volume of the remaining portion of the initial hard mask pattern.

13. The method according to claim 1, wherein the etching target layer includes one or more layers having a variable resistance characteristic.

14. The method according to claim 13, wherein the etching target layer includes a Magnetic Tunnel Junction (MTJ) structure that includes a free layer having a variable magnetization direction, a pinned layer having a fixed magnetization direction, and a tunnel barrier layer interposed between the free layer and the pinned layer.

15. The method according to claim 1, wherein, in the forming of the hard mask pattern, the impurity is doped into at least a portion of the etching target layer.

16. An electronic device comprising a semiconductor memory,
wherein the semiconductor memory comprises:
a substrate; and
a variable resistance element formed over the substrate, and
wherein at least a portion of a sidewall of the variable resistance element further contains Si or B compared to a remaining portion of the variable resistance element.

17. The electronic device according to claim 16, wherein the portion of variable resistance element is relatively amorphous compared to the remaining portion of the variable resistance element.

18. The electronic device according to claim 16, wherein the variable resistance element includes a Magnetic Tunnel Junction (MTJ) structure that includes a free layer having a variable magnetization direction, a pinned layer having a fixed magnetization direction, and a tunnel barrier layer interposed between the free layer and the pinned layer.

19. The electronic device according to claim 16, further comprising a microprocessor which includes:
a control unit configured to receive a signal including a command from an outside of the microprocessor, and performs extracting, decoding of the command, or controlling input or output of a signal of the microprocessor;
an operation unit configured to perform an operation based on a result that the control unit decodes the command; and
a memory unit configured to store data for performing the operation, data corresponding to a result of performing the operation, or an address of data for which the operation is performed,
wherein the semiconductor memory is part of the memory unit in the microprocessor.

20. The electronic device according to claim 16, further comprising a processor which includes:
a core unit configured to perform, based on a command inputted from an outside of the processor, an operation corresponding to the command, by using data;
a cache memory unit configured to store data for performing the operation, data corresponding to a result of performing the operation, or an address of data for which the operation is performed; and
a bus interface connected between the core unit and the cache memory unit, and configured to transmit data between the core unit and the cache memory unit,
wherein the semiconductor memory is part of the cache memory unit in the processor.

21. The electronic device according to claim 16, further comprising a processing system which includes:
a processor configured to decode a command received by the processor and control an operation for information based on a result of decoding the command;
an auxiliary memory device configured to store a program for decoding the command and the information;
a main memory device configured to call and store the program and the information from the auxiliary memory device such that the processor can perform the operation using the program and the information when executing the program; and
an interface device configured to perform communication between at least one of the processor, the auxiliary memory device and the main memory device and the outside,
wherein the semiconductor memory is part of the auxiliary memory device or the main memory device in the processing system.

22. The electronic device according to claim 16, further comprising a data storage system which includes:
a storage device configured to store data and conserve stored data regardless of power supply;
a controller configured to control input and output of data to and from the storage device according to a command inputted from an outside;
a temporary storage device configured to temporarily store data exchanged between the storage device and the outside; and
an interface configured to perform communication between at least one of the storage device, the controller and the temporary storage device and the outside,
wherein the semiconductor memory is part of the storage device or the temporary storage device in the data storage system.

23. The electronic device according to claim 16, further comprising a memory system which includes:
a memory configured to store data and conserve stored data regardless of power supply;
a memory controller configured to control input and output of data to and from the memory according to a command inputted from an outside;
a buffer memory configured to buffer data exchanged between the memory and the outside; and
an interface configured to perform communication between at least one of the memory, the memory controller and the buffer memory and the outside,
wherein the semiconductor memory is part of the memory or the buffer memory in the memory system.

* * * * *